(12) United States Patent
Nieh et al.

(10) Patent No.: US 8,304,319 B2
(45) Date of Patent: Nov. 6, 2012

(54) METHOD FOR MAKING A DISILICIDE

(75) Inventors: Chun-Wen Nieh, Hsinchu (TW);
Hung-Chang Hsu, Kaohsiung (TW);
Wen-Chi Tsai, Hsinchu (TW); Mei-Yun Wang, Chu-Pei (TW); Chii-Ming Wu, Taipei (TW); Wei-Jung Lin, Taipei (TW); Chih-Wei Chang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 161 days.

(21) Appl. No.: 12/836,026

(22) Filed: Jul. 14, 2010

(65) Prior Publication Data

US 2012/0012903 A1   Jan. 19, 2012

(51) Int. Cl.
*H01L 21/4763* (2006.01)
*H01L 21/8222* (2006.01)

(52) U.S. Cl. ........ 438/301; 438/630; 438/648; 438/649; 438/655; 438/664; 257/E21.199; 257/E21.619

(58) Field of Classification Search .................. 438/301, 438/630, 648, 649, 655, 664; 257/E21.199, 257/E21.619
See application file for complete search history.

(56) References Cited

U.S. PATENT DOCUMENTS

| | | | |
|---|---|---|---|
| 2005/0112857 A1* | 5/2005 | Gluschenkov et al. | 438/585 |
| 2008/0090369 A1* | 4/2008 | Akiyama et al. | 438/308 |
| 2008/0121882 A1* | 5/2008 | Hwang et al. | 257/51 |
| 2009/0042359 A1* | 2/2009 | Lindsay et al. | 438/433 |
| 2010/0105185 A1* | 4/2010 | Ku et al. | 438/301 |
| 2011/0212590 A1* | 9/2011 | Wu et al. | 438/303 |

* cited by examiner

*Primary Examiner* — Ngan Ngo
(74) *Attorney, Agent, or Firm* — Lowe Hauptman Ham & Berner, LLP (57) ABSTRACT

Methods for fabricating a semiconductor device are disclosed. A metal-rich silicide and/or a mono-silicide is formed on source/drain (S/D) regions. A millisecond anneal is provided to the metal-rich silicide and/or the mono-silicide to form a di-silicide with limited spikes at the interface between the silicide and substrate. The di-silicide has an additive which can lower the electron Schottky barrier height.

9 Claims, 8 Drawing Sheets

METHOD FOR MAKING A DISILICIDE

RELATED APPLICATIONS

The present disclosure is related to the following commonly-assigned U.S. patent applications, the entire disclosures of which are incorporated herein by reference: U.S. Publication No. 2009/0020757 for "FLASH ANNEAL FOR a PAI, NiSi PROCESS."

TECHNICAL FIELD

The present disclosure relates generally to the field of a semiconductor device and a method of manufacturing a semiconductor device, and more particularly to a silicide structure and a method for forming a silicide on source/drain regions.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, for semiconductor devices, such as a metal-oxide-semiconductor field-effect transistors (MOSFETs), a stressor may be implanted on source/drain regions to strain the source/drain features (e.g., stressor regions) to enhance carrier mobility and improve device performance.

Forming epitaxial (epi) semiconductor materials on the source/drain regions is one of the existing approaches for enhancing carrier mobility and improving device performance. There is still a need to provide more stress on the source/drain regions to further improve the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1A:
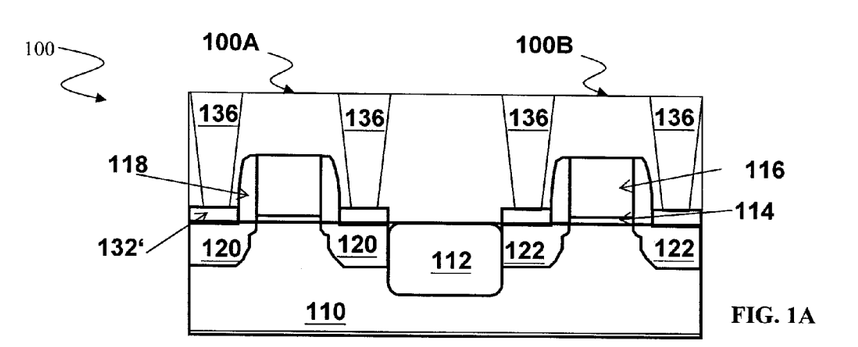
FIG. 1A is a schematic cross-sectional view of an integrated circuit device taken from either axis A-A or B-B of FIG. 1B or FIG. 1C, respectively, according to one embodiment illustrating an exemplary integrated circuit device.

FIG. 1A is a schematic cross-sectional view illustrating a semiconductor device 100. The semiconductor device 100 may use a substrate 110. In some embodiments, the substrate 110 is a semiconductor substrate comprising silicon. Alternatively, the substrate 110 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer.

The substrate 110 may include various doped regions depending on design requirements as known in the art (e.g., p-type wells or n-type wells). The doped regions may be doped with p-type dopants, such as boron or $BF_2$, and/or n-type dopants, such as phosphorus or arsenic. The doped regions may be formed directly on the substrate 110, in a P-well structure, in a N-well structure, in a dual-well structure, or using a raised structure. In some embodiments, the semiconductor substrate 110 includes various active regions, such as regions configured for an N-type metal-oxide-semiconductor transistor device (referred to as an NMOS) 100A and regions configured for a P-type metal-oxide-semiconductor transistor device (referred to as a PMOS) 100B.

An isolation region 112 is in the substrate 110 to isolate various regions of the substrate 110, and in the present embodiment, to isolate the NMOS device 100A and the PMOS device 100B. The isolation region 112, for example, is a shallow trench isolation (STI) and comprises silicon oxide, silicon nitride, silicon oxynitride, other suitable materials, or combinations thereof.

The NMOS 100A and the PMOS 100B may each include a gate stack, comprising a gate electrode 116 overlying a gate dielectric 114. In one embodiment, the gate electrode 116 is a polysilicon layer and has a di-silicide (not shown), e.g., $NiSi_2$, therein. In another embodiment, the gate electrode 116 is a metal gate and the gate dielectric 114 comprises a high-k dielectric. Spacers 118 are adjacent to sidewalls of the gate stack. The spacers 118 comprise, for example, silicon nitride, silicon carbide, silicon oxynitride, silicon nitride oxide, other suitable materials, and/or combinations thereof. Source/drain (S/D) regions 120/122 are in the substrate 210 and adjacent to edges of the gate dielectric 114 for each of the NMOS/PMOS devices 100A/100B.

Metal silicides 132' are over the source/drain (S/D) regions 120/122. In one embodiment, the metal silicide 132' comprises at least an amount of di-silicide, e.g., $NiSi_2$. Though, $NiSi_2$ may have a resistance higher than mono-silicide (NiSi), $NiSi_2$ has higher tensile stress thereby enhancing carrier mobility in the source/drain (S/D) regions 120 and improving performance of the NMOS devices 100A. In one embodiment, the metal silicide 132' comprises more than 50% of di-silicide. In another embodiment, the metal silicide 132' comprises nickel di-silicide with an additive, including B, $BF_2$, C, N, F, Si, P, S, As, Ti, Al, Co, Ge, Se, Pd, In, Sb, Ta, Pt, Sc, Y, Ho, Tb, Gd, Lu, Dy, Er, Yb, or combinations thereof. Contact features 136, for example, tungsten, are formed on the metal silicide 132' for providing a path of an electrical connection.

Figure 1B:
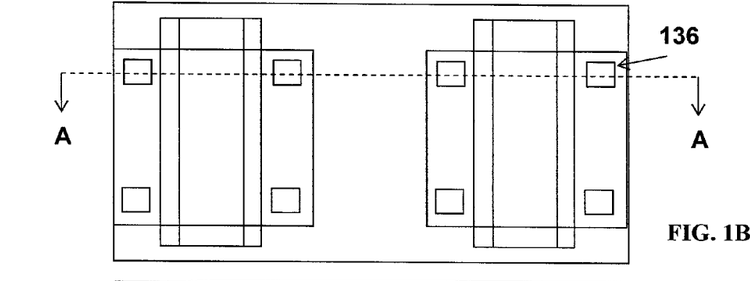
FIG. 1B is a schematic top view of the integrated circuit device of FIG. 1A according to one embodiment.
Figure 1C:
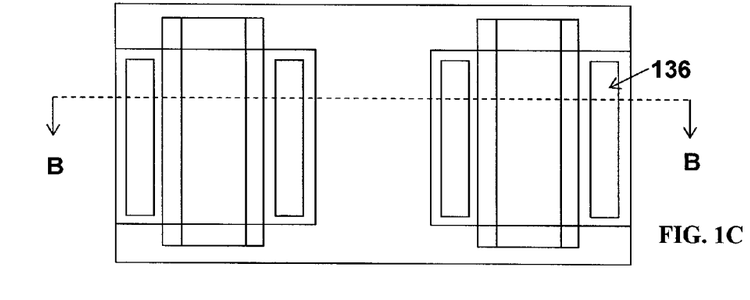
FIG. 1C is a schematic top view of the integrated circuit device of FIG. 1A according to another embodiment.

In one embodiment, the contact features 136 are via contacts (FIG. 1B) or slot contacts (FIG. 1C). In another embodiment, the contact features 136A are slot contacts which has a length/width ratio larger than 2.

FIGS. 2-7 are schematic cross-sectional views illustrating an exemplary process flow for forming a semiconductor device. Items of FIGS. 2-7 that are the same items in FIG. 1A are indicated by the same reference numerals, increased by 100. With reference to FIGS. 2-7 and 8, a semiconductor device 200 and a method 300 are collectively described below.

The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, high frequency transistors, other suitable components, and/or combinations thereof.

Figure 2:
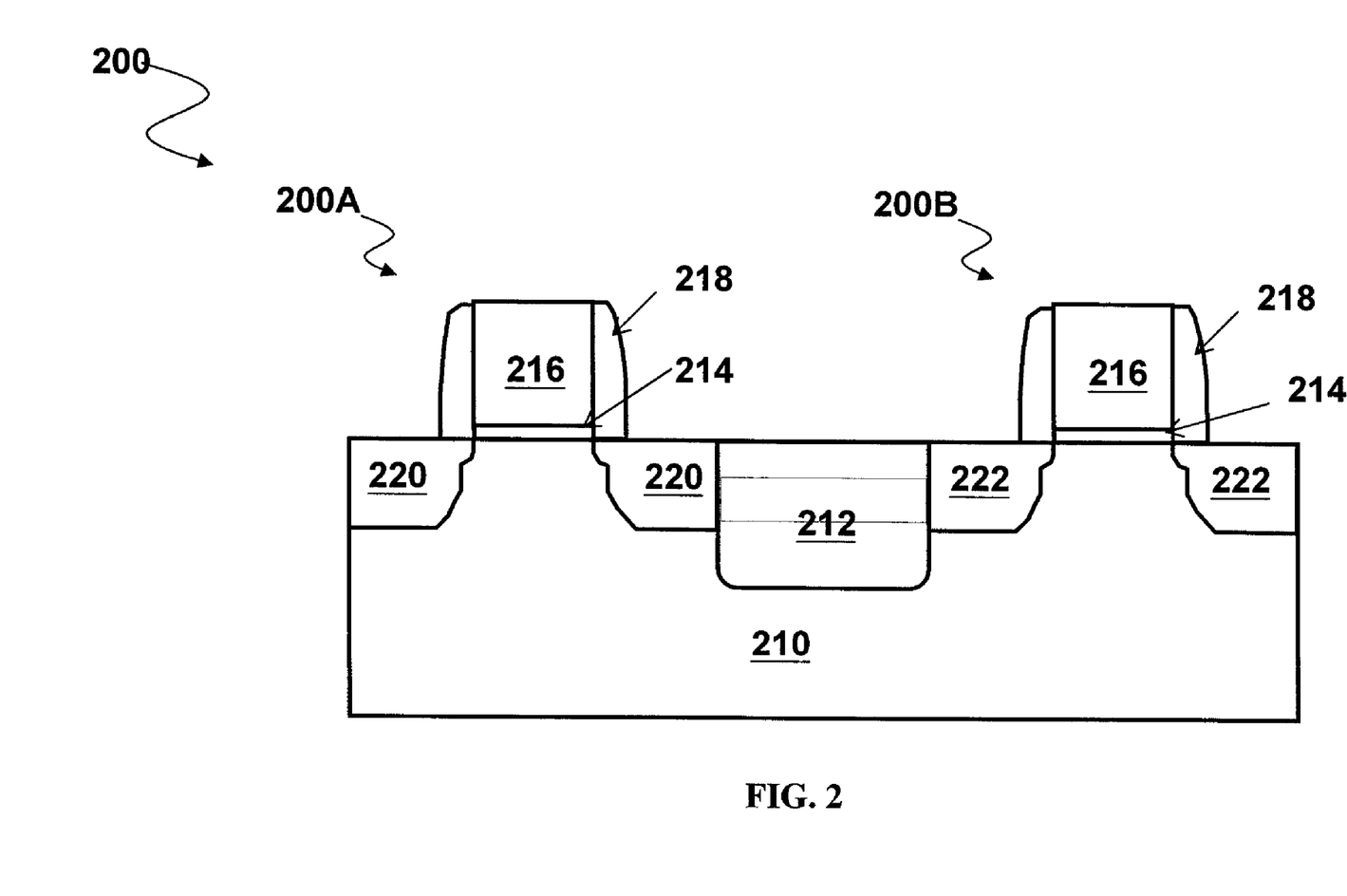
FIGS. 2-7 are various cross-sectional views of embodiments of an integrated circuit device during various fabrication stages according to the method of FIG. 8.
Figure 8:
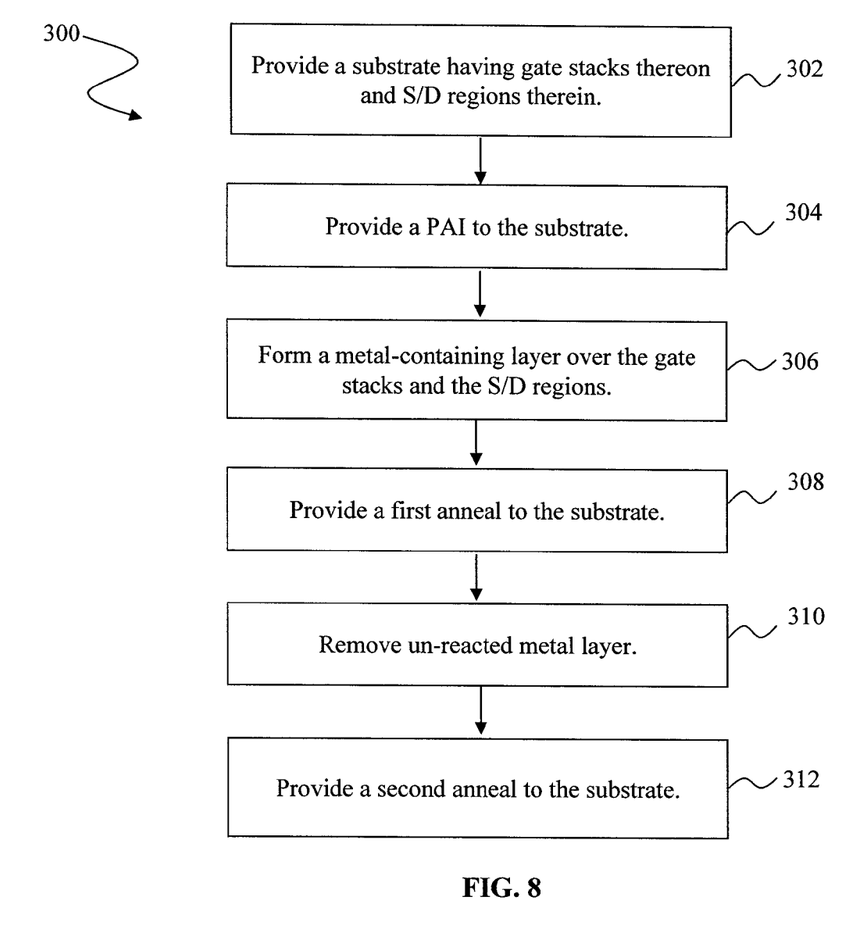
FIG. 8 is a flow chart of a method for fabricating an integrated circuit device according to aspects of the present disclosure.

Referring to FIGS. 2 and 8, the method 300 begins at a step 302, wherein a substrate 210 is provided. In the present embodiment, the substrate 210 is a semiconductor substrate comprising silicon. The substrate 210 may include various doped regions depending on design requirements as known in the art (e.g., p-type wells or n-type wells). The doped regions may be doped with p-type dopants, such as boron or $BF_2$, and/or n-type dopants, such as phosphorus or arsenic. The doped regions may be formed directly on the substrate 210, in a P-well structure, in a N-well structure, in a dual-well structure, or using a raised structure. In some embodiments, the semiconductor substrate 210 includes various active regions, such as regions configured for an N-type metal-oxide-semiconductor transistor device (referred to as an NMOS) 200A and regions configured for a P-type metal-oxide-semiconductor transistor device (referred to as a PMOS) 200B.

The NMOS 200A and the PMOS 200B may each include a gate stack, comprising a gate electrode 216 overlying a gate dielectric 214 by any suitable process to any suitable thickness. In the present embodiment, the gate electrode 216 is a polysilicon layer. The polysilicon (or poly) layer is formed by chemical vapor deposition (CVD) or other suitable deposition process. For example, silane ($SiH_4$) may be used as a chemical gas in the CVD process to form the gate electrode 216. The gate electrode 216 may include a thickness ranging from about 400 to about 800 angstrom (Å). In some embodiments, gate electrode 216 and/or the gate dielectric 214 may be sacrificial and will be removed by a subsequent gate replacement step. Spacers 218 may be adjacent to sidewalls of the gate stack. Source/drain (S/D) regions 220/222 may be formed in the substrate 210 for the NMOS/PMOS devices 200A/200B by an implantation process. It is understood that the semiconductor device 200 may be formed by CMOS technology processing, and thus some processes are not described in detail herein.

An exemplary isolation region 212 is formed in the substrate 210 to isolate various regions of the substrate 210, and in the present embodiment, to isolate the NMOS device 200A and the PMOS device 200B. The isolation region 212 utilizes isolation technology, such as local oxidation of silicon (LOCOS) or shallow trench isolation (STI), to define and electrically isolate the various regions. In the present embodiment, the isolation region 212 includes a STI. The isolation region 212 comprises silicon oxide, silicon nitride, silicon oxynitride, other suitable materials, or combinations thereof. The isolation region 212 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. In some examples, the filled trench may have a multi-layer structure such as a thermal oxide liner layer filled with silicon nitride or silicon oxide.

Figure 3:
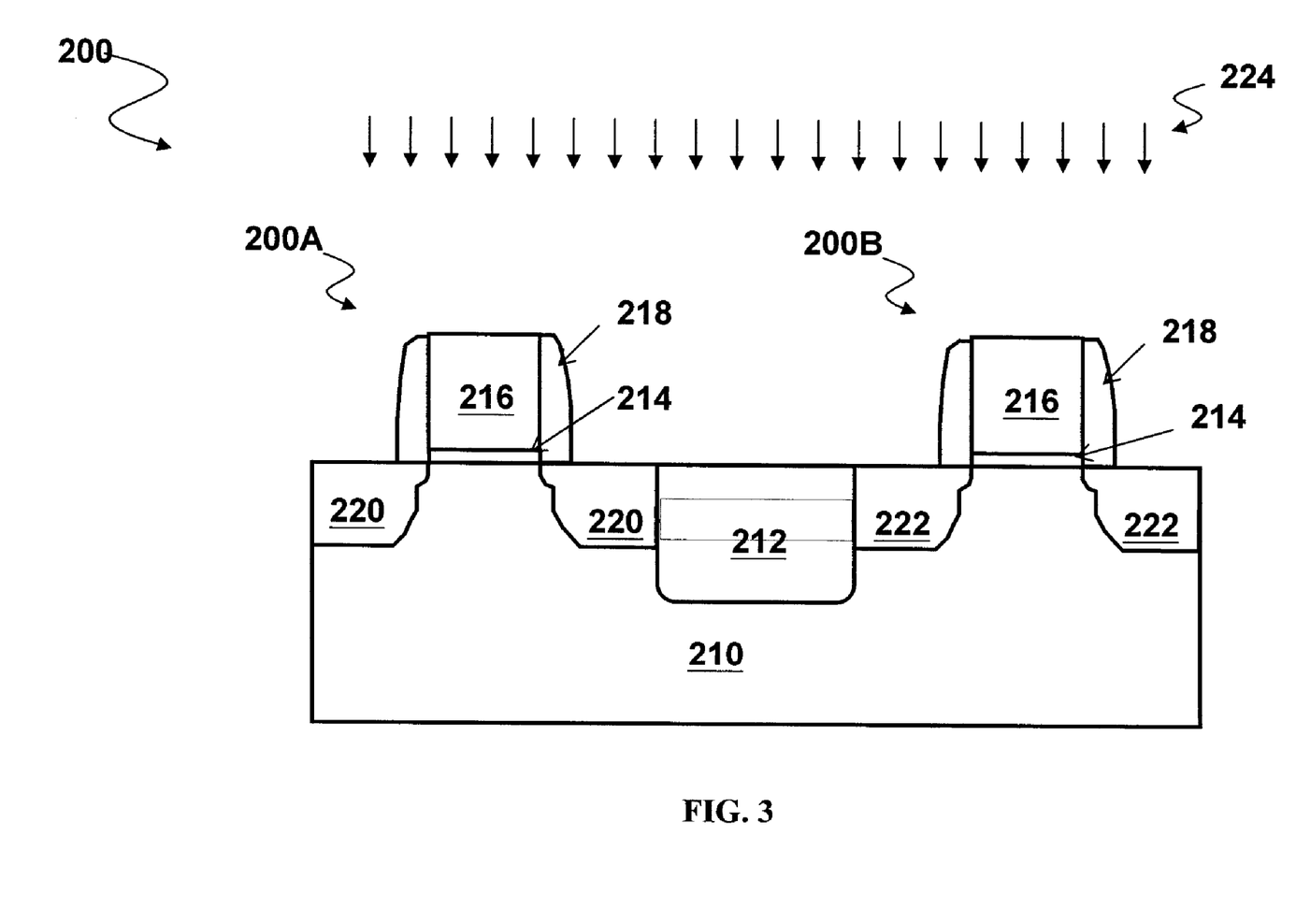

Referring to FIGS. 3 and 8, the method 300 proceeds to a step 304, wherein a pre-amorphous implant (PAI) 224 is provided to the substrate 210 to transform at least a portion of the S/D regions 220/222 and/or the gate electrodes 216 to PAI-induced amorphous regions (not shown). In some embodiments, the PAI-induced amorphous regions are located in the upper portion of the S/D regions 220/222 and/or the gate electrodes 216.

The PAI 224, for example, comprises an ion implanting process using He, C, N, F, Si, Ar, Ge, In, Xe, Ir, Os, Pt, Sc, Y, Ho, Tb, Gd, Lu, Dy, Er, Yb, or combinations thereof. The implanting process may be performed at an energy ranging from about 3 KeV to about 30 KeV, and with a dose of around 5E13 to around 1E15 atoms per square centimeter ($atm/cm^2$) with an implant tilt approximating 10 degrees. Doses, energies, and tilt angles may be varied within the spirit and scope of this illustrative embodiment.

Figure 4:
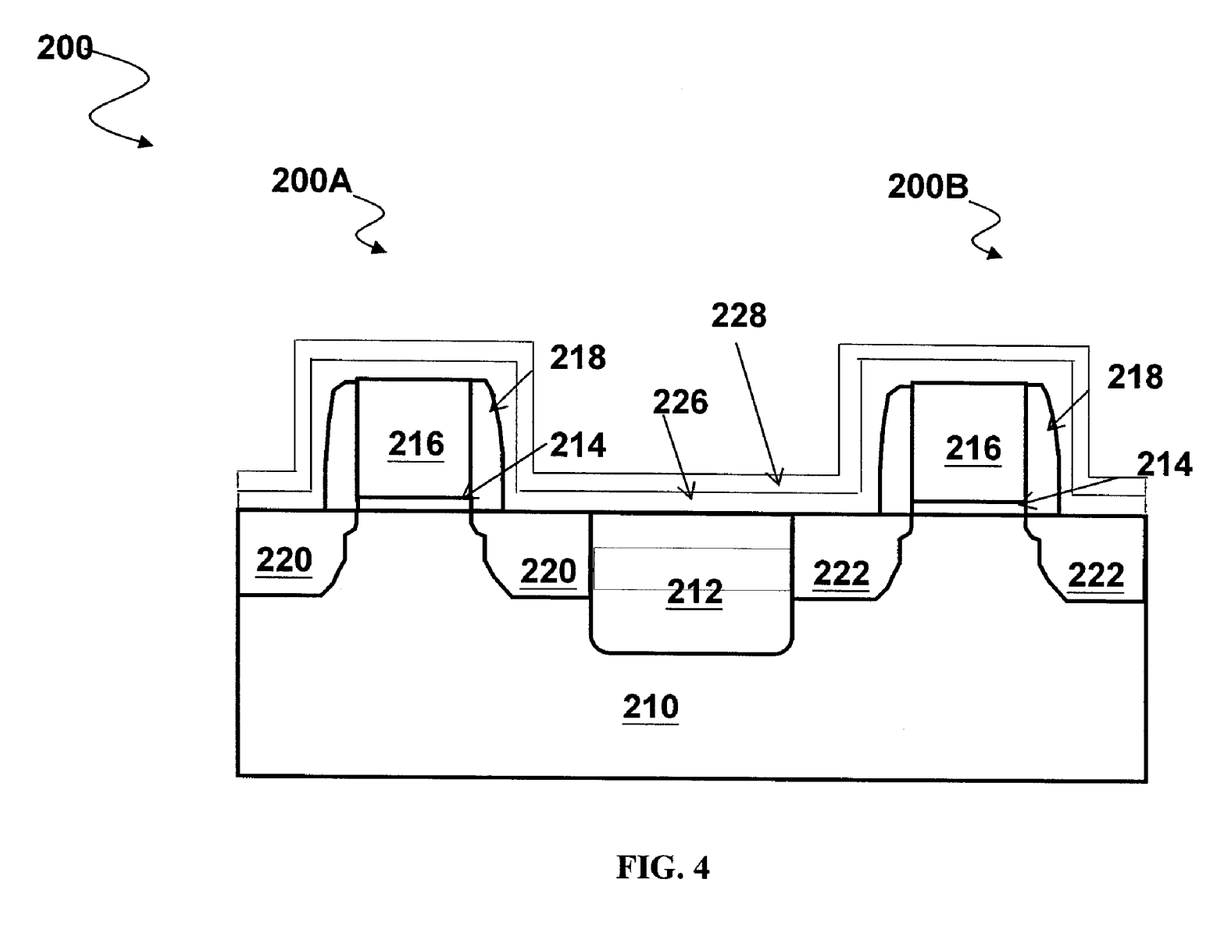

Referring to FIGS. 4 and 8, the method 300 proceeds to a step 306, wherein a metal-containing layer 226 is formed over the gate electrodes 216 and the S/D regions 220/222. In one embodiment, the metal-containing layer 226 comprises titanium (Ti), cobalt (Co), nickel (Ni), or combinations thereof. In another embodiment, the metal-containing layer 226 is a nickel-containing layer. The metal-containing layer 226 may be formed by CVD, physical vapor deposition (PVD), atomic layer deposition (ALD), and/or other suitable processes, and is generally formed by a PVD process. In one embodiment, an additive can be mixed in a PVD target for forming the metal-containing layer 226, whereby the metal-containing layer 226 with the additive can be formed by one PVD deposition process. In another embodiment, an additive layer (not shown) is deposited under the metal-containing-layer 226 to form a bi-layered metal-containing structure. The additive, for example, includes Ti, Al, Co, Ta, Sb, Pt, Sc, Y, Ho, Tb, Gd, Lu, Dy, Er, Yb, or combinations thereof. In another embodiment, an additive, including B, $BF_2$, C, N, F, Si, P, S, As, Ti, Al, Co, Ge, Se, Pd, In, Sb, Ta, Pt, Sc, Y, Ho, Tb, Gd, Lu, Dy, Er, Yb, or combinations thereof, can be entered in the metal-containing layer 226 by an implanting process before or after the deposition of the metal-containing layer 226. The metal-containing layer 226 may have a thickness ranging between about 10 nm and about 80 nm.

A capping layer 228 is then formed on the metal-containing layer 226. In some embodiments, the capping layer 228 is TiN and may have a thickness ranging between about 10 nm and about 30 nm. In one embodiment, the capping layer 228 may be formed by CVD, PVD, ALD, and/or other suitable process. In another embodiment, the capping layer 228 is in-situ formed after deposition of the metal-containing layer 226.

Figure 5:
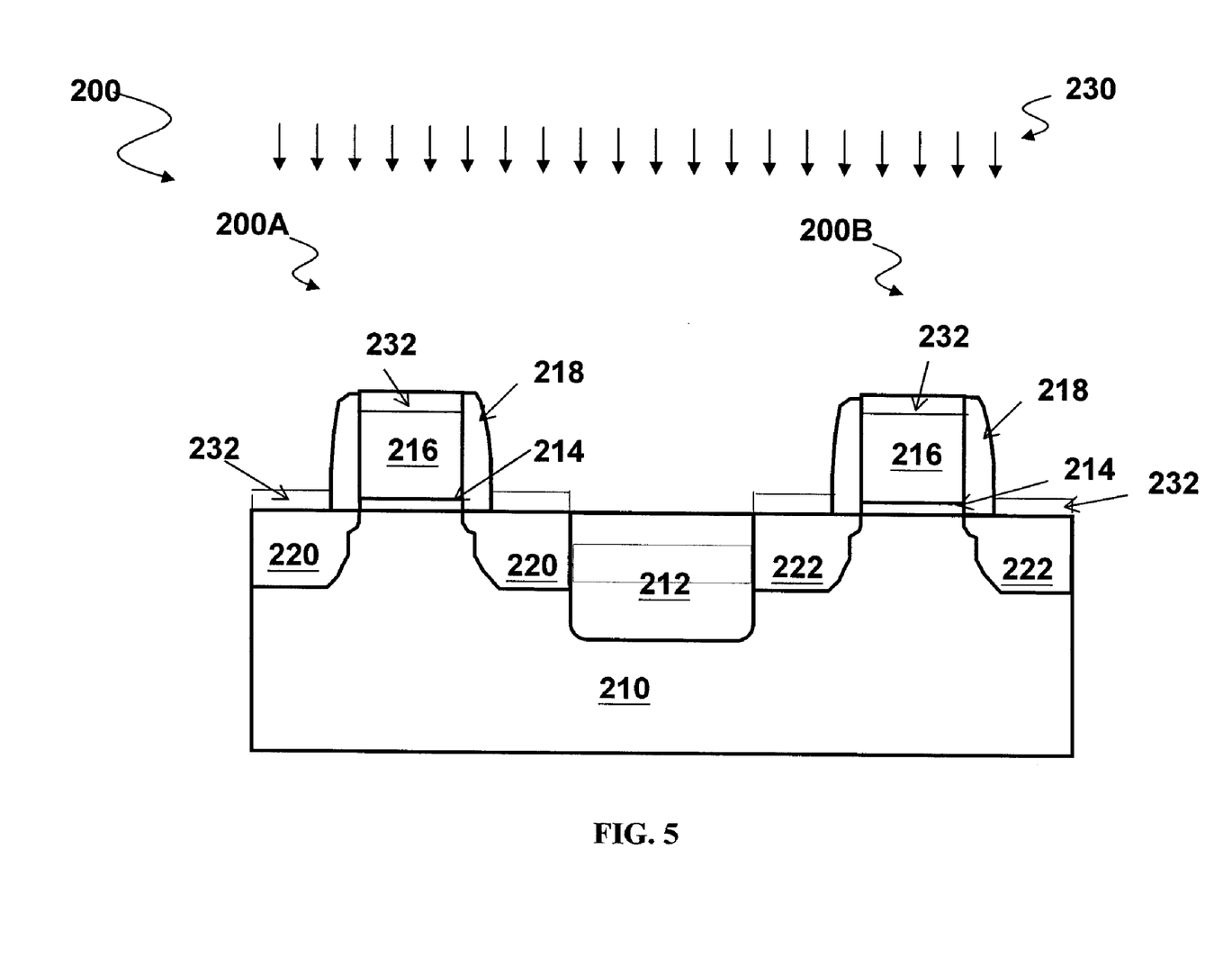

Referring to FIGS. 5 and 8, the method 300 continues with a step 308, wherein a first anneal 230 is provided to form a initial metal silicide 232 by reacting the metal-containing layer 226 with the silicon element in the underlying gate electrodes 216 and the S/D regions 220/222. The first anneal 230 may be performed by a rapid thermal anneal (RTA) and/or a millisecond anneal (MSA). The millisecond anneal, in some embodiments, comprises flash anneal, laser anneal, or the like. In some embodiments, the first anneal 230 is performed at a temperature ranging between about 150° C. and about 500° C. In one embodiment, the first anneal 230 has a duration of about 0.2 ms to about 10 ms when using MSA. In another embodiment, the first anneal 230 has a duration of about 1 sec to about 10 minutes when using RTA. In some embodiments, the initial metal silicide 232 is a metal-rich silicide, e.g., $Ni_2Si$, a mono-silicide, e.g., nickel silicide (NiSi), or a mixture of metal-rich silicide and mono-silicide.

After silicidation, the method 300 continues with a step 310, wherein the capping layer 228 may be removed using a removal process such as dry etching and/or wet etching. Then, the unreacted metal-containing layer 226 may be removed, as illustrated in FIG. 5.

Figure 6:
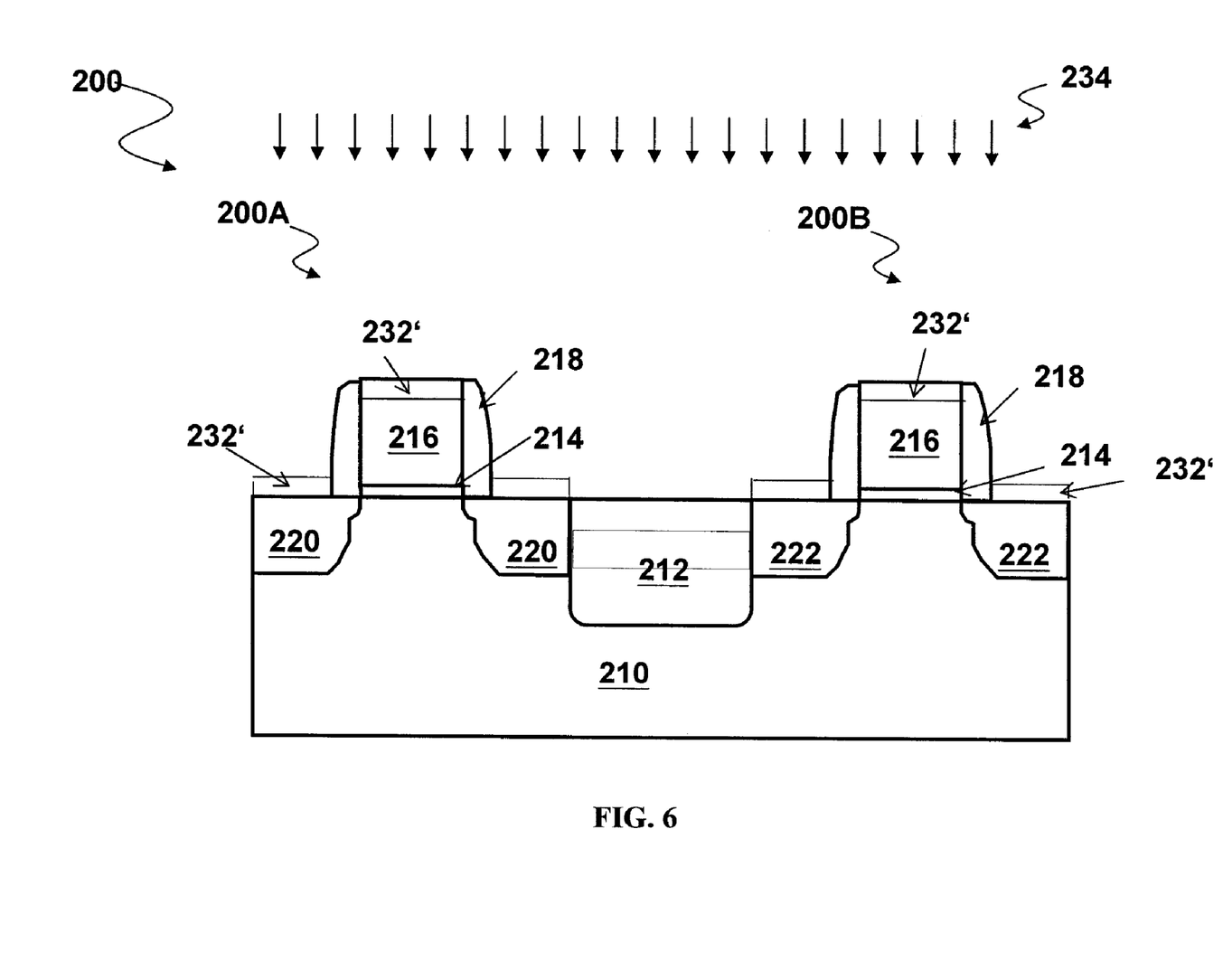

Referring to FIGS. 6 and 8, the method 300 continues with a step 312, wherein a second anneal 234 is provided to convert the initial metal silicide 232 to a metal silicide 232'. In some embodiments, the metal silicide 232' may comprise di-silicide, for example $NiSi_2$. In some embodiments, the second anneal 234 is a millisecond anneal process, comprising a flash anneal, a laser anneal, combination thereof, or the like. The millisecond anneal 234 may be performed at a temperature ranging between about 600° C. and about 950° C., and has a duration of about 0.2 ms to about 10 ms. By using the short period of time (millisecond) for phase transformation, the spikes normally formed in the interface between the di-silicide and the substrate can be decreased. Therefore, the metal silicide 232' may have a lower resistance ranging between about 50 μΩ-cm and about 90 μΩ-cm.

Generally, the transformation temperature for forming the di-silicide is much higher than the temperature for forming mono-silicide. Hence, silicon agglomeration very likely takes place during the high temperatures process, which may cause the di-silicide with a high resistivity to be formed and cause a serious degradation in the performance of the devices. The initial metal silicide 232 may comprise the additive as mentioned above, which can lower the transformation temperature for forming the di-silicide, and therefore prevent the formation of silicon agglomeration and lower the resistance of the metal silicide 232'. Other than adding the additive in the nickel-containing layer 226, the timing for entering the additive may be during the formation of the source/drain regions 220/222, during the formation of the PAI-induced amorphous regions, or before/after the second anneal 224. In addition, the additive added in the di-silicide may further decrease an electron Schottky barrier height of the di-silicide to about 0.2 eV to about 0.5 eV.

PAI-induced amorphous regions formed by the PAI may further prevent spikes formed in the interface between the di-silicide and the substrate 210 and reduce junction leakage.

Contact features 236 may be formed after a step of gate replacement wherein the initial poly gate electrode is removed and replaced by a metal gate. The contact features 236 on the metal silicide 232' of the S/D regions (FIG. 7) may comprise tungsten formed by any suitable processes. In some embodiments, the contact features 236 are slot contacts.

Figure 7:
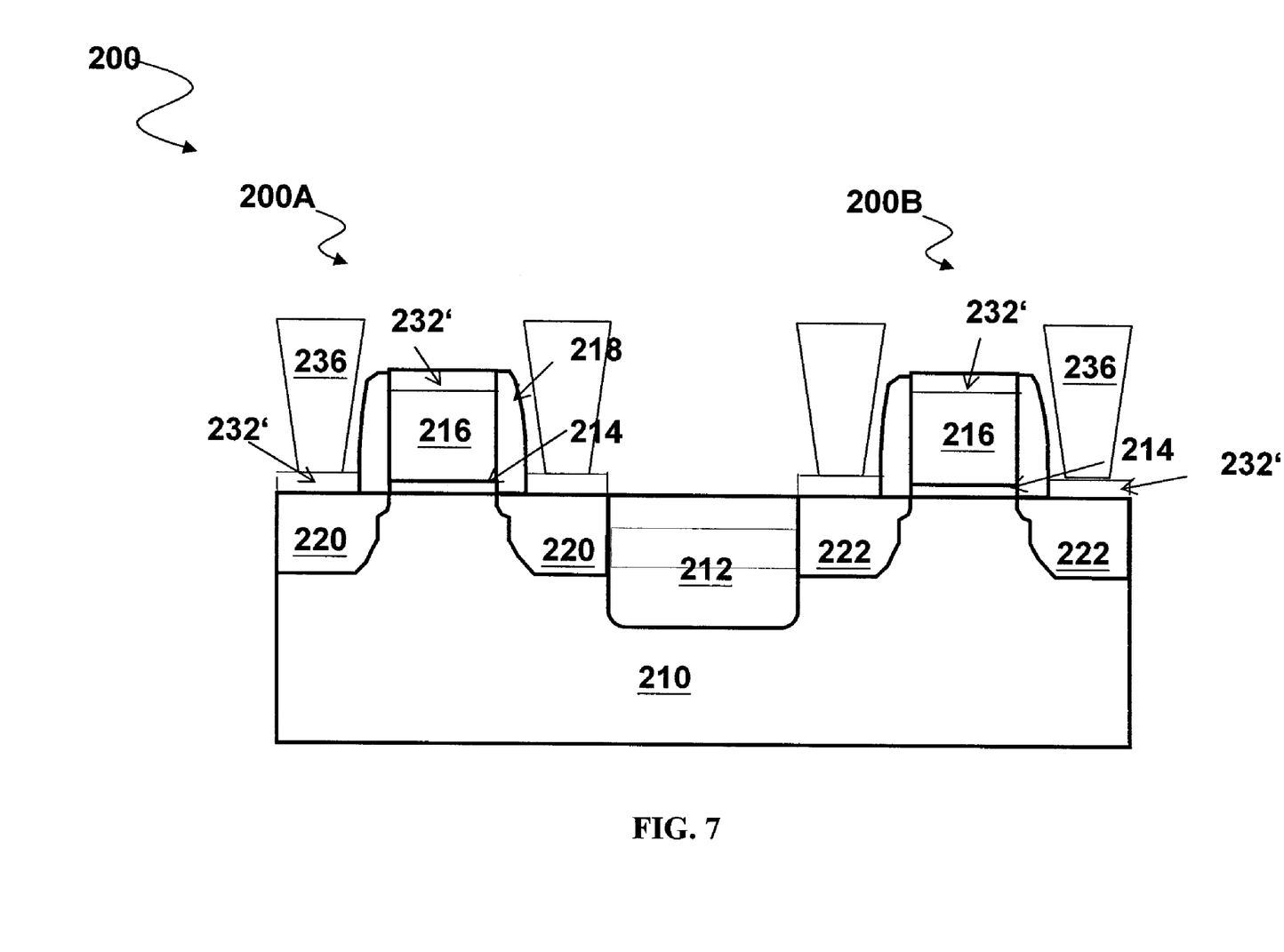

Though di-silicide may have a resistivity higher than mono-silicide, it is noted that di-silicide has an electron Schottky barrier height lower than mono-silicide. Therefore, there is a smaller interface resistance between the di-silicide 232' and the underlying substrate 210. It is noted that the electrical path of the device 200 is positioned in the interface between the metal silicide 232' and the underlying substrate 210, instead of in the metal silicide 232'. Hence, the di-silicide 232' with higher resistivity will not degrade the performance of the devices 200.

It is noted that di-silicide has a tensile stress higher than mono-silicide. Hence, di-silicide can enhance device performance, especially for NMOS 200A, by enhancing carrier mobility in the source/drain (S/D) region 220.

It is still noted that di-silicide has a thermal stability better than mono-silicide, which may contribute to the thermal stability of the device 200.

It is noted that the method described above in conjunction with FIGS. 2-7 is merely exemplary. One of skill in the art can modify the flow of the method to achieve desired integrated circuit device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated circuit device, the method comprising:
    providing a substrate;
    forming a gate stack overlying the substrate;
    forming source and drain regions in the substrate;
    thereafter implanting an ion species causing amorphous regions in the S/D regions;
    forming a nickel-containing layer on the S/D regions;
    reacting the nickel-containing layer with the S/D regions to form a nickel-rich silicide and/or a nickel mono- silicide;
    removing portions of the nickel-containing layer that are un-reacted; and
    performing a millisecond anneal to transform the nickel-rich silicide and/or the nickel mono- silicide to a nickel di-silicide, wherein the nickel di-silicide has an additive therein.

2. The method of claim 1, wherein the additive is entered by an ion implantation process during or after the formation of the S/D regions, during or after the formation of the amorphous regions, before the step of millisecond anneal, or after the step of millisecond anneal.

3. The method of claim 1, wherein the nickel-containing layer has the additive comprising B, $BF_2$, C, N, F, Si, P, S, As, Al, Ti, Co, Ge, Se, Pd, In, Sb, Ta, Pt, Sc, Y, Ho, Tb, Gd, Lu, Dy, Er, Yb, or combinations thereof.

4. The method of claim 1, wherein the additive lowers the electron Schottky barrier height of the nickel di-silicide to about 0.2 eV and about 0.5 eV.

5. The method of claim 1, wherein the millisecond anneal is performed at a temperature ranging between about 600° C. to and about 950° C.

6. The method of claim 1, further comprising forming a capping layer on the nickel-containing layer before the step of reacting the nickel-containing layer.

7. The method of claim 1, wherein reacting the nickel-containing layer with the S/D regions is performed at a temperature ranging between about 150° C. to and about 500° C.

8. The method of claim 1, wherein the millisecond anneal has a duration ranging about 0.2 ms and about 10 ms.

9. The method of claim 1, further comprising forming contact features over the nickel di-silicide.

* * * * *